United States Patent
Sung et al.

(10) Patent No.: US 11,515,402 B2
(45) Date of Patent: Nov. 29, 2022

(54) MICROELECTRONIC TRANSISTOR SOURCE/DRAIN FORMATION USING ANGLED ETCHING

(71) Applicant: Intel Corporation, Santa Clara, CA (US)

(72) Inventors: Seung Hoon Sung, Portland, OR (US); Robert B. Turkot, Hillsboro, OR (US); Marko Radosavljevic, Beaverton, OR (US); Han Wui Then, Portland, OR (US); Willy Rachmady, Beaverton, OR (US); Sansaptak Dasgupta, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 945 days.

(21) Appl. No.: 16/081,403

(22) PCT Filed: Mar. 30, 2016

(86) PCT No.: PCT/US2016/024866
§ 371 (c)(1),
(2) Date: Aug. 30, 2018

(87) PCT Pub. No.: WO2017/171741
PCT Pub. Date: Oct. 5, 2017

(65) Prior Publication Data
US 2021/0210620 A1    Jul. 8, 2021

(51) Int. Cl.
*H01L 29/66* (2006.01)
*H01L 21/3065* (2006.01)
(Continued)

(52) U.S. Cl.
CPC .... *H01L 29/66636* (2013.01); *H01L 21/3065* (2013.01); *H01L 29/0847* (2013.01);
(Continued)

(58) Field of Classification Search
CPC .......... H01L 29/66636; H01L 21/3065; H01L 29/0847
See application file for complete search history.

(56) References Cited

U.S. PATENT DOCUMENTS 6,605,845 B1 * 8/2003 Liang ................. H01L 21/2815
257/368
2006/0194381 A1 * 8/2006 Wei .................. H01L 29/66659
257/E21.345
(Continued)

FOREIGN PATENT DOCUMENTS

TW    201528342    7/2015

OTHER PUBLICATIONS

Office Action from Taiwanese Patent Application No. 106104099 dated Mar. 29, 2021, 12 pgs.
(Continued)

*Primary Examiner* — Errol V Fernandes
(74) *Attorney, Agent, or Firm* — Essential Patents Group, LLP (57) ABSTRACT

The present description relates to the fabrication of microelectronic transistor source and/or drain regions using angled etching. In one embodiment, a microelectronic transistor may be formed by using an angled etch to reduce the number masking steps required to form p-type doped regions and n-type doped regions. In further embodiments, angled etching may be used to form asymmetric spacers on opposing sides of a transistor gate, wherein the asymmetric spacers may result in asymmetric source/drain configurations.

6 Claims, 8 Drawing Sheets

(51) Int. Cl.
    *H01L 29/08*    (2006.01)
    *H01L 29/49*    (2006.01)
(52) U.S. Cl.
    CPC ...... *H01L 29/4983* (2013.01); *H01L 29/6656* (2013.01); *H01L 29/66977* (2013.01)

(56) References Cited

U.S. PATENT DOCUMENTS

| | | |
|---|---|---|
| 2009/0159936 A1 | 6/2009 | Shah et al. |
| 2010/0019323 A1 | 1/2010 | Shin |
| 2010/0025744 A1 | 2/2010 | Miyashita et al. |
| 2010/0181618 A1 | 7/2010 | Meunier-Bellard et al. |
| 2011/0297961 A1* | 12/2011 | Bunin ............... H01L 29/42316 257/76 |
| 2012/0235244 A1 | 9/2012 | Yin et al. |

OTHER PUBLICATIONS

Notice of Allowance from Taiwanese Patent Application No. 16/081,403 dated Jun. 30, 2021, 3 pgs.
International Search Report and Written Opinion from PCT/US2016/024866 dated Dec. 26, 2016, 12 pgs.
International Preliminary Report on Patentability from PCT/US2016/0248666 dated Oct. 11, 2018, 9 pgs.

* cited by examiner

MICROELECTRONIC TRANSISTOR SOURCE/DRAIN FORMATION USING ANGLED ETCHING

CLAIM OF PRIORITY

This Application is a National Stage Entry of, and claims priority to, PCT Application No. PCT/US2016/024866, filed on 30 Mar. 2016 and titled "MICROELECTRONIC TRANSISTOR SOURCE/DRAIN FORMATION USING ANGLED ETCHING", which is incorporated by reference in its entirety for all purposes.

TECHNICAL FIELD

Embodiments of the present description generally relate to the field of microelectronic devices, and, more particularly, to using angled etching to fabricate microelectronic transistors.

BACKGROUND

Higher performance, lower cost, increased miniaturization of integrated circuit components, and greater packaging density of integrated circuits are ongoing goals of the microelectronic industry for the fabrication of microelectronic devices. To achieve these goals, there is a drive to improve efficiency with improvements in their designs, materials used, and/or in their fabrication processes.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description relate to the fabrication of microelectronic transistor source and drain regions using angled etching. In one embodiment, a microelectronic transistor may be formed by using an angled etch to reduce the number masking steps required to form p-type doped regions and n-type doped regions. In further embodiments, angled etching may be used to form asymmetric spacers on opposing sides of a transistor gate, wherein the asymmetric spacers may result in asymmetric source/drain configurations.

Figure 1:
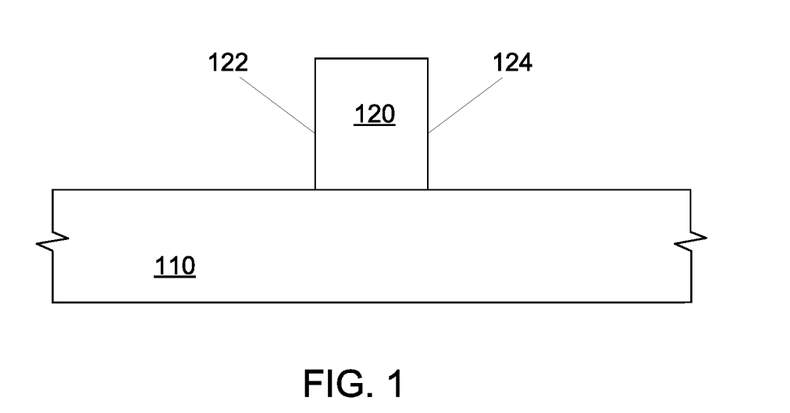
FIGS. 1-7 are side cross-sectional views of a process of using an angled etch to form p-type doped regions and/or n-type doped regions for a microelectronic transistor, according to an embodiment of the present description.

FIGS. 1-7 illustrate a method of using an angled etch to reduce the masking steps needed to form p-type doped regions and n-type doped regions for a microelectronic transistor. For the sake of conciseness and clarity, a single microelectronic transistor will be illustrated. As illustrated in FIG. 1, a microelectronic substrate 110 may be provided or formed from any suitable material. In one embodiment, the microelectronic substrate 110 may be a bulk substrate composed of a single crystal of a material which may include, but is not limited to, silicon, germanium, silicon-germanium or a III-V compound semiconductor material. In other embodiments, the microelectronic substrate 110 may comprise a silicon-on-insulator substrate (SOI), wherein an upper insulator layer composed of a material which may include, but is not limited to, silicon dioxide, silicon nitride or silicon oxy-nitride, disposed on the bulk substrate. Alternatively, the microelectronic substrate 110 may be formed directly from a bulk substrate and local oxidation is used to form electrically insulative portions in place of the above described upper insulator layer. The microelectronic substrate 110 may also be other types of substrates, such as germanium, gallium arsenide, indium antimonide, lead telluride, indium arsenide, indium phosphide, gallium arsenide, gallium antimonide, and the like, any of which may be combined with silicon.

As further shown in FIG. 1, a transistor gate 120 may be formed on the microelectronic substrate 110. The transistor gate 120 may be a sacrificial gate (shown), which would be removed and replace with a gate electrode (not shown) with a gate dielectric (not shown) disposed between the gate electrode and the microelectronic substrate 110 in subsequent processing, as will be understood to those skilled in the art. It is understood that the transistor gate 120 could include the gate dielectric (not shown) and the gate electrode (not shown) at this point. The functions and fabrication processes for the gate electrode and the gate dielectric are well known in the art and for the sake of conciseness and clarity will not be discussed herein. The transistor gate 120 may include a first sidewall 122 and an opposing second sidewall 124. In a further embodiment, the transistor gate 120 may be formed with an aspect ratio trapping, such as to form germanium and III-V material devices on silicon. Aspect Ratio Trapping is known in the art and for the sake of conciseness and clarity will not be discussed herein.

Figure 2:
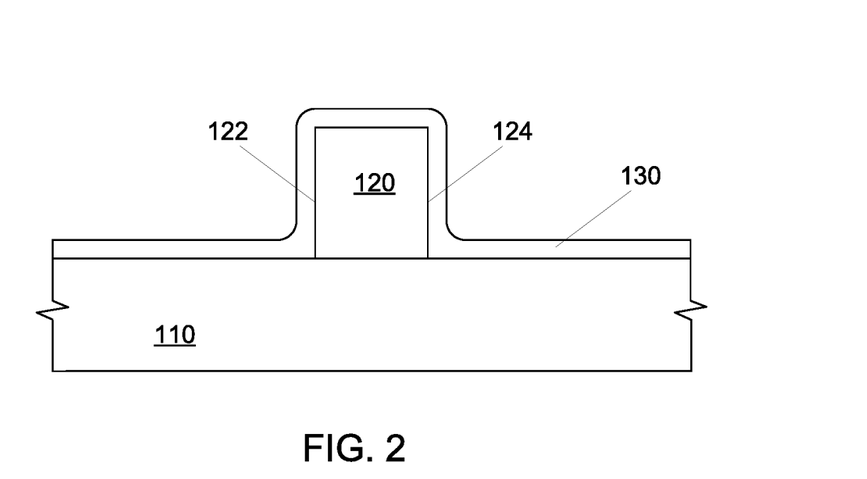

As shown in FIG. 2, a first spacer material layer 130 may be deposited over the transistor gate 120 and the microelectronic substrate 110. The first spacer material layer 130 may be made of any appropriate dielectric material, such as silicon nitride (e.g. $Si_3N_4$), silicon oxynitride (e.g. SiON), silicon oxycarbonitride (e.g. SiOCN), or silicon carbonitride (e.g. SiCN).

Figure 3:
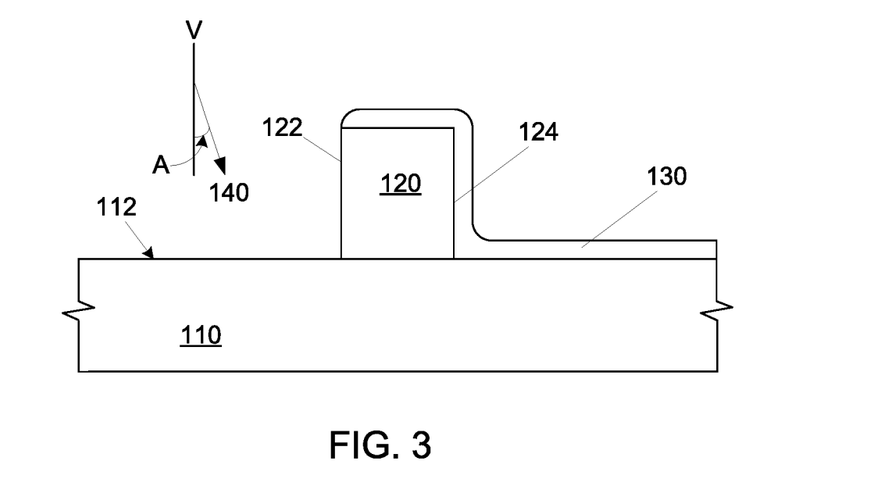

As shown in FIG. 3, a first angled etch (shown as arrow 140) may be directed toward the first sidewall 122 of the transistor gate 120. With the first angled etch 140, the transistor gate 120 shields the first spacer material layer 130 proximate the second sidewall 124 of the transistor gate 120, such that at least a portion of the first spacer material layer 130 may be removed from the transistor gate first sidewall 122 and such that the first spacer material layer 130 may be entirely removed on the microelectronic substrate 110 proximate the transistor gate first sidewall 122 to form an exposed first portion 112 of the microelectronic substrate 110, while remaining on the microelectronic substrate 110 proximate the transistor gate second sidewall 124. In one embodiment, the first spacer material layer 130 may be entirely removed from the transistor gate first sidewall 122, as shown. The angled etch proposed in the present description may be a plasma etching process wherein a stream of glow discharge (i.e. plasma) of an appropriate etchant gas mixture is direct to a target at an appropriate angle to achieve the results discussed above. In one embodiment, the first spacer material layer 130 may be silicon nitride wherein an etchant gas mixture may be a fluoromethane/argon/oxygen mixture. In a further embodiment, a distribution angle A of the glow discharge stream (direction shown by the arrow of the first angled etch 140) may be between about 5 and 25 degrees from vertical V.

Figure 4:
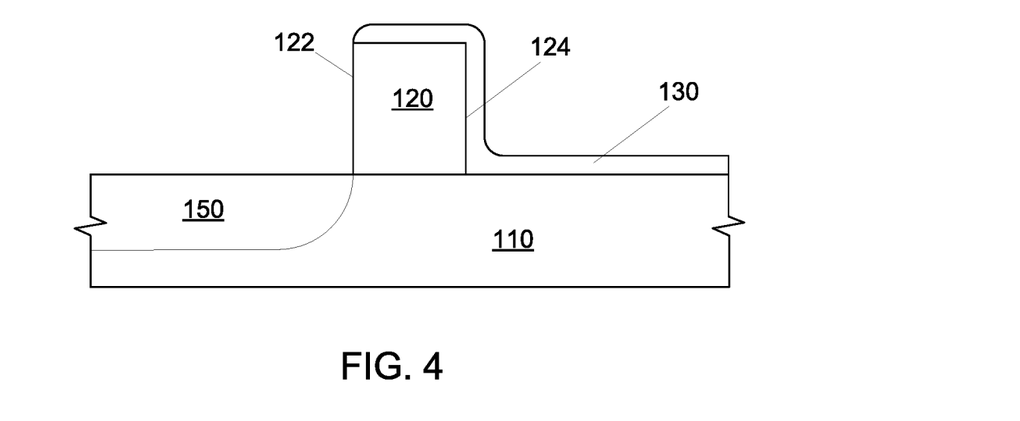

As shown in FIG. 4, a first doped region 150 may then be formed in the microelectronic substrate 110 at the exposed first portion 112. The first doped region 150 may be formed any process known in the art, including but not limited to, implantation or regrowth, as will be understood to those skilled in the art. The first doped region 150 may be one of a p-type doped region or a n-type doped region. A p-type doped region may be doped with a p-type dopant, including, but not limited to, boron, aluminum, nitrogen, gallium, and indium. An n-type doped region may be doped with an n-type dopant, including but limited to, phosphorous, arsenic, antimony, bismuth, and lithium.

Figure 5:
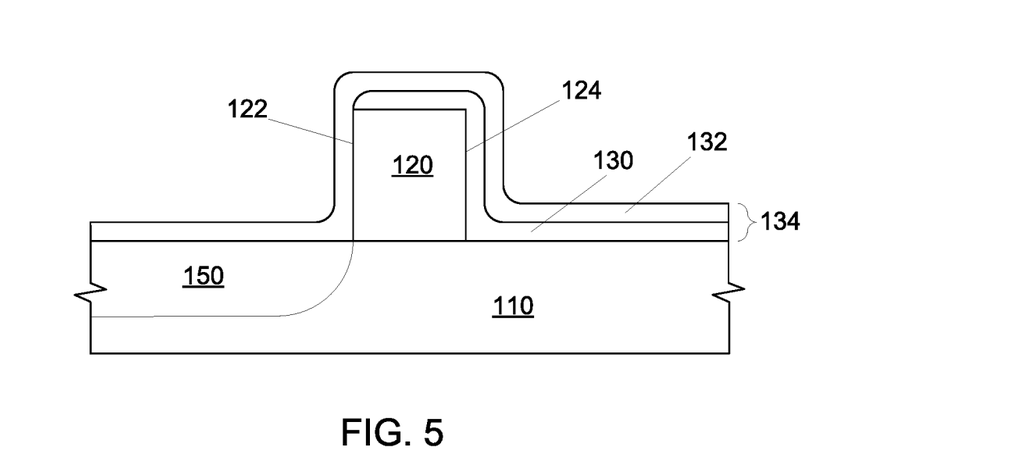

As shown in FIG. 5, a second spacer material layer 132 may be deposited over the remaining first spacer material layer 130 to form a spacer material bi-layer 134, over the transistor gate first sidewall 122, and over the first portion 112 of the microelectronic substrate 110. The second spacer material layer 132 may be any appropriate dielectric material, such as silicon nitride (e.g. $Si_3N_4$), silicon oxynitride (e.g. SiON), silicon oxycarbonitride (e.g. SiOCN), or silicon carbonitride (e.g. SiCN).

Figure 6:
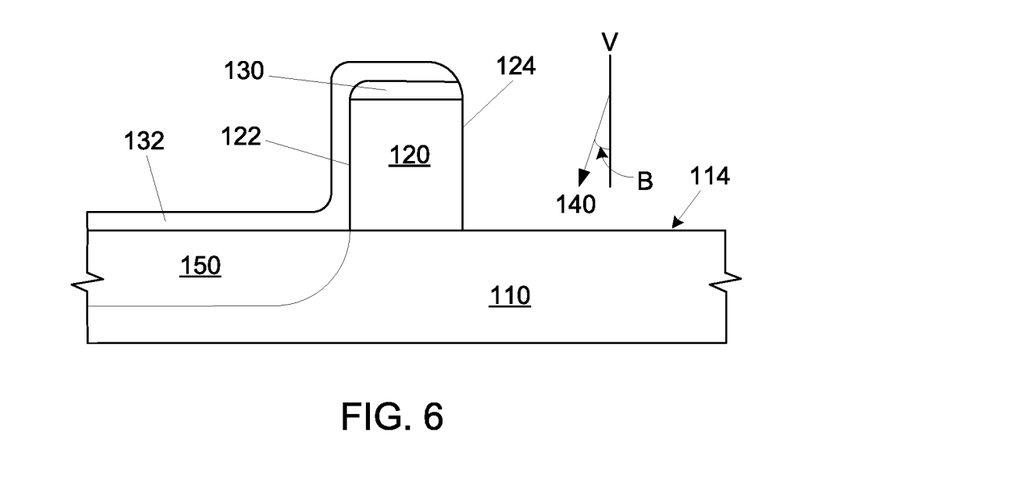

As shown in FIG. 6, a second angled etch (shown as arrow 142) may be directed toward the second sidewall 124 of the transistor gate 120. With the second angled etch 142, the transistor gate 120 shields the second spacer material layer 132 proximate the first sidewall 122 of the transistor gate 120, such that at least a portion of the spacer material bi-layer 134 may be removed from the transistor gate first sidewall 122 and such that the spacer material bi-layer 134 may be entirely removed on the microelectronic substrate 110 proximate the transistor gate second sidewall 124 to form an exposed second portion 114 of the microelectronic substrate 110, while remaining on the microelectronic substrate 110 proximate the transistor gate first sidewall 122. In one embodiment, the first spacer material layer 130 may be entirely removed from the transistor gate second sidewall 124, as shown. In one embodiment, the second spacer material layer 132 may be silicon nitride wherein an etchant gas mixture may be fluoromethane/argon/oxygen mixture. In a further embodiment, a distribution angle B of the glow discharge stream (direction shown by the arrow of the second angled etch 142) may be between about 5 and 25 degree from vertical V, where vertical V is substantially perpendicular with the microelectronic substrate 110.

Figure 7:
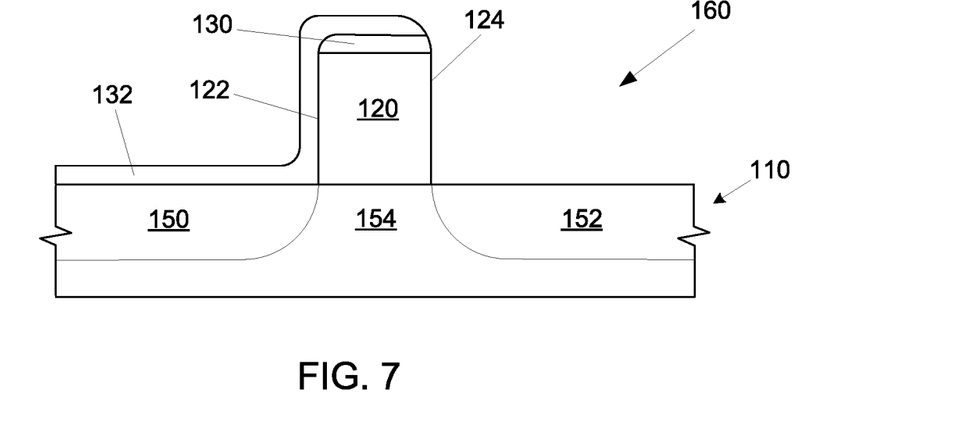

As shown in FIG. 7, a second doped region 152 may then be formed in the microelectronic substrate 110 at the second portion 114 (see FIG. 6). The second doped region 152 may be formed any process known in the art, including but not limited to, implantation or regrowth, as will be understood to those skilled in the art. The second doped region 152 may be one of a p-type doped region or an n-type doped region, which is opposite to that of the first doped region 150. As it can be further seen in FIG. 7, a portion of the microelectronic substrate 110 under the transistor gate 120 will be undoped, thereby forming an instrinic region 154. Thus, for example, when the first doped region 150 is p-type doped, the second doped region 152 will be n-type doped, which forms the basic P-I-N (p-type/intrinsic/n-type) junction for a tunnel field effect transistor (TFET), e.g. a microelectronic transistor 160.

Figure 8:
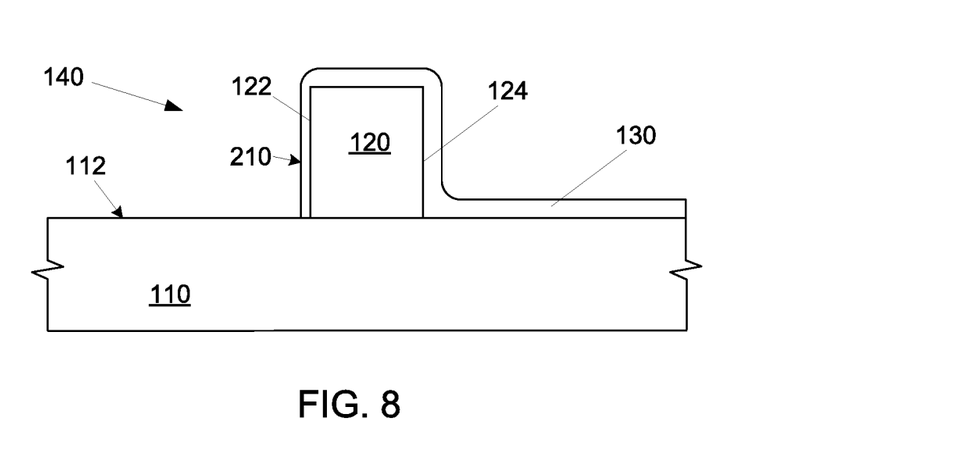
FIGS. 8-11 are side cross-sectional views of a process of using an angled etch to form raised doped regions by regrowth, according to one embodiment of the present description.

FIGS. 8-11 illustrate another embodiment of the present description wherein raised doped regions are formed by regrowth. Beginning with FIG. 2, the first angled etch 140 may be directed toward the first sidewall 122 of the transistor gate 120, as shown in FIG. 8. With the first angled etch 140, the transistor gate 120 shields the first spacer material layer 130 proximate the second sidewall 124 of the transistor gate 120, such that at least a portion of the first spacer material layer 130 may be removed from the transistor gate first sidewall 122 and such that the first spacer material layer 130 may be entirely removed on the microelectronic substrate 110 proximate the transistor gate first sidewall 122 to form the exposed first portion 112, while remaining on the microelectronic substrate 110 proximate the transistor gate second sidewall 124. In one embodiment, a portion of the first spacer material layer 130 may remain on the transistor gate first sidewall 122 forming a first spacer 210 to protect the transistor gate 120 during a subsequent etching process, as will be discussed.

Figure 9:
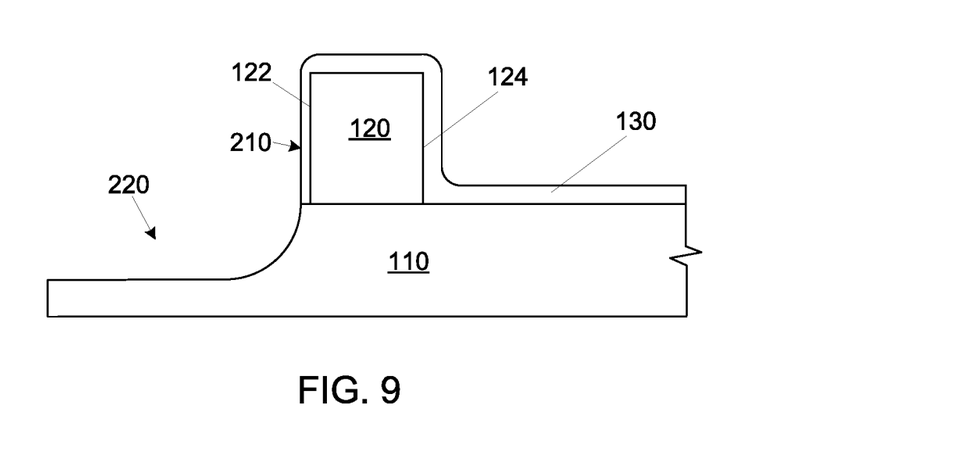
Figure 10:
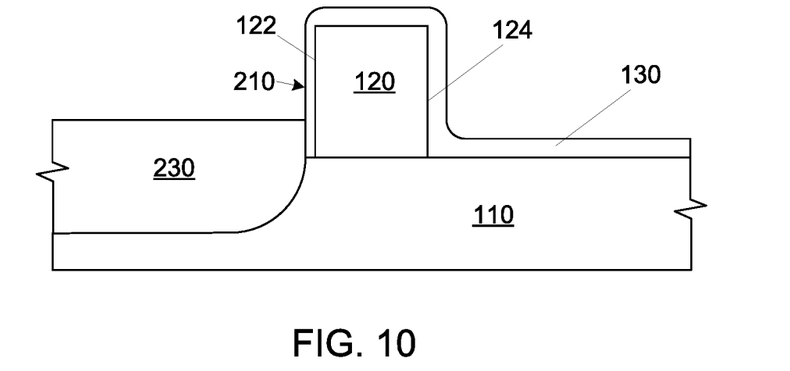
Figure 11:
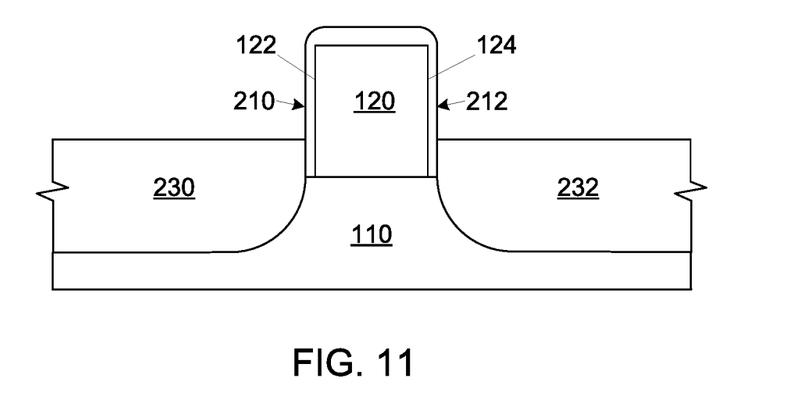

As shown in FIG. 9, a portion of the microelectronic substrate 110 at the exposed first portion 112 (see FIG. 8) may be removed to form a recess 220 by an anisotropic etch. As shown in FIG. 10, a regrowth process may be followed to form a raised first doped region 230, i.e. where a portion of the raised first doped region 230 extends above the microelectronic substrate 110. The etching processes for forming the recess 220 and for the regrowth processes for forming the raised first doped region 230 are well known in the art and for the sake of conciseness and clarity will not be discussed herein. A similar process as described with regard to FIG. 5 for forming the second spacer material layer 132 and similar processes with regard to FIGS. 9 and 10 may be followed to from a second spacer 212 adjacent the transistor gate second sidewall 124 and a raised second doped region 232 on the side of the transistor gate 120 opposite the raised first doped region 230, as shown in FIG. 11. With an anisotropic etch and the presence of the first spacer 210 and the second spacer 212 may result in the raised first doped region 230 and the raised second doped region 232 being spaced from the transistor gate 120, which may result in a lower overlap capacitance (Cov) and a higher external resistance (Rext) for each, as will be understood to those skilled in the art.

Figure 12:
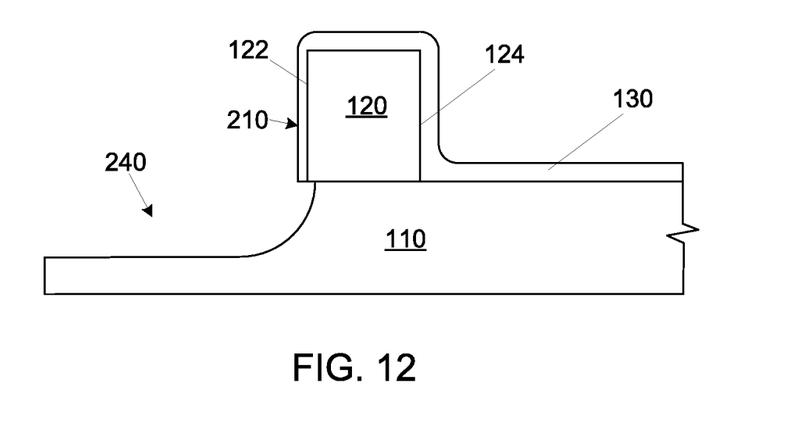
FIGS. 12-14 are side cross-sectional views of a process of using an angled etch to form raised doped regions by regrowth, according to another embodiment of the present description.
Figure 13:
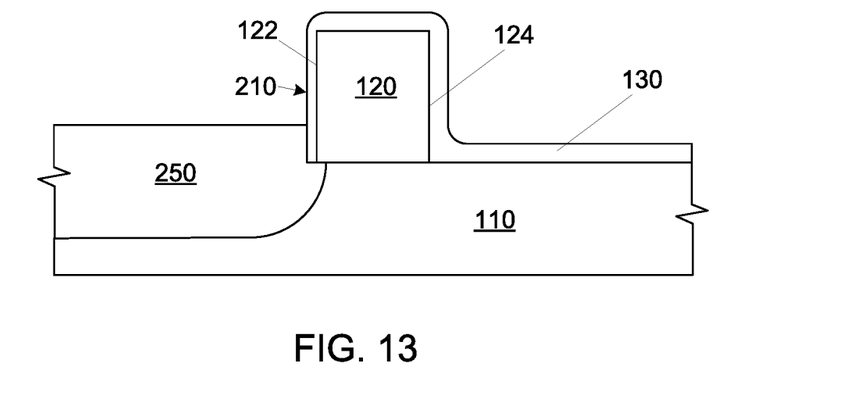
Figure 14:
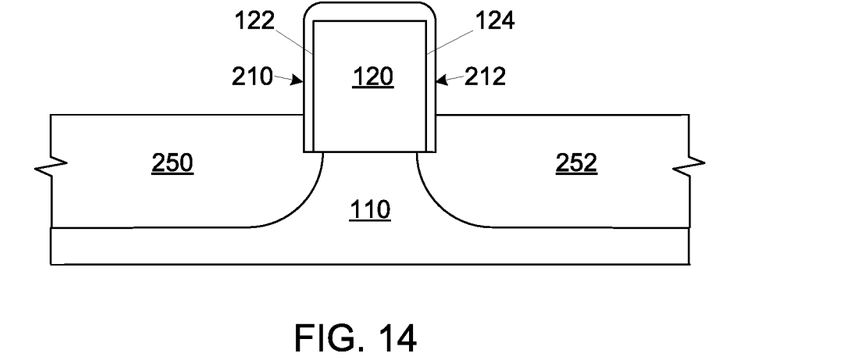

FIGS. 12-15 illustrate yet another embodiment of the present description wherein raised doped regions are formed by regrowth. Beginning with FIG. 9, a portion of the microelectronic substrate 110 at the exposed first portion 112 may be removed with either an isotropic etch or an appropriate anisotropic etch to form an undercut recess 240, as shown in FIG. 12. As shown in FIG. 13, a regrowth process may be followed to form an undercut raised first doped region 250. The etching processes for forming the undercut recess 240 and for the regrowth processes for forming the undercut raised first doped region 250 are well known in the art and for the sake of conciseness and clarity will not be discussed herein. A similar process as described with regard to FIG. 5 for forming the second spacer material layer 130 and similar processes with regard to FIGS. 9 and 12 may be followed to from the second spacer 212 adjacent the transistor gate second sidewall 124 and an undercut raised second doped region 252 on the side of the transistor gate 120 opposite the undercut raised first doped region 250, as shown in FIG. 14. With an isotropic etch undercutting the first spacer 210 and the second spacer 212, the undercut first doped region 250 and the undercut second doped region 252 may be position closer to the transistor gate 120, which may result in a higher overlap capacitance (Cov) and a lower external resistance (Rext) for each, as will be understood to those skilled in the art.

In another embodiment of the present description, the angled etch may used to achieve an asymmetric source and drain design to improve transistor performance. As will be understood to those skilled in the art, external resistance (Rext) control is critical to achieving higher drain current saturation (Id sat). However, the external resistance on the source side plays a more critical role in the drain current saturation because it lowers the effective voltage gate source (Vgs) and voltage drain source (Vds). The external resistance on the drain side has more of an impact on the linear drain current (Id lin) due to the lower effective voltage drain source. This allows for design flexibility to achieve a matched current saturation while lowering an overlap capacitance (Cov) on the drain side. It is noted that the overlap capacitance (Cov) will play a role in the circuit performance because the Miller effect will make the overlap capacitance larger than that estimated by calculation, which can degrade circuit performance. However, the following embodiment of an asymmetric source/drain design and implementation can enable a lower overlap capacitance on the drain side and a matched external resistance on the source side.

Figure 15:
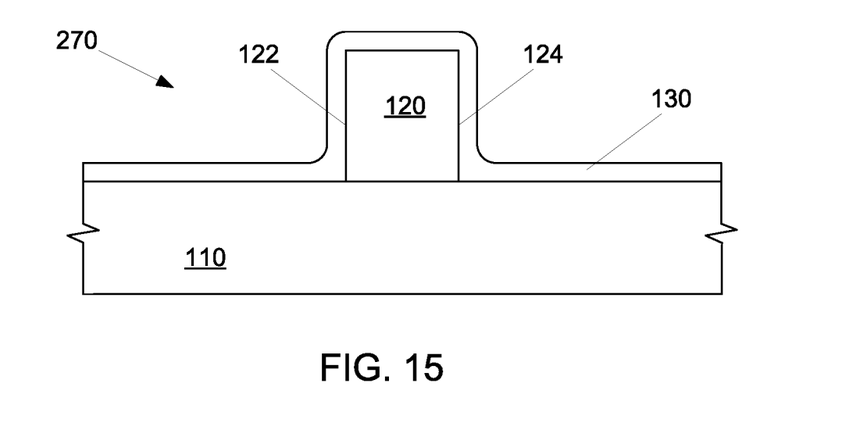
FIGS. 15-17 are side cross-sectional views of a process of using an angled etch to form asymmetric doped regions for a microelectronic transistor, according to still another embodiment of the present description.
Figure 16:
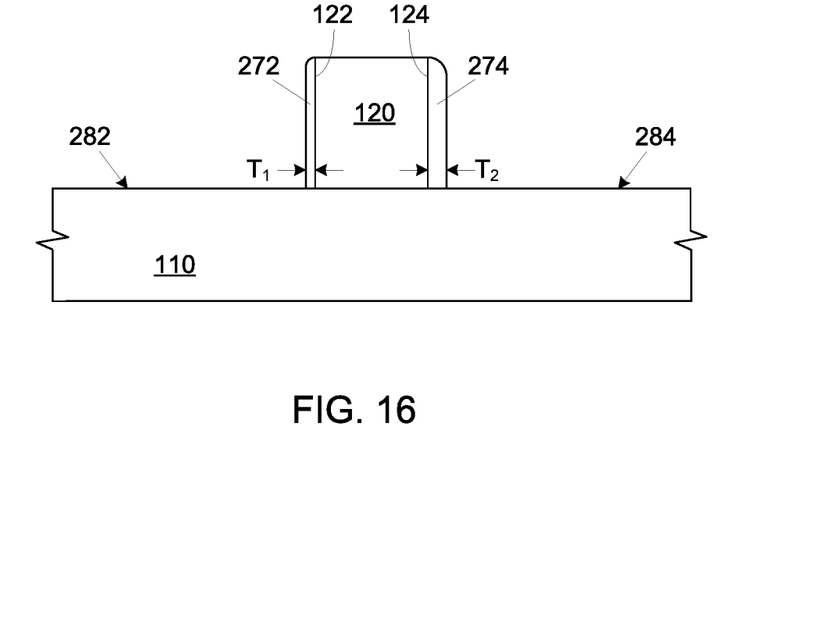
Figure 17:
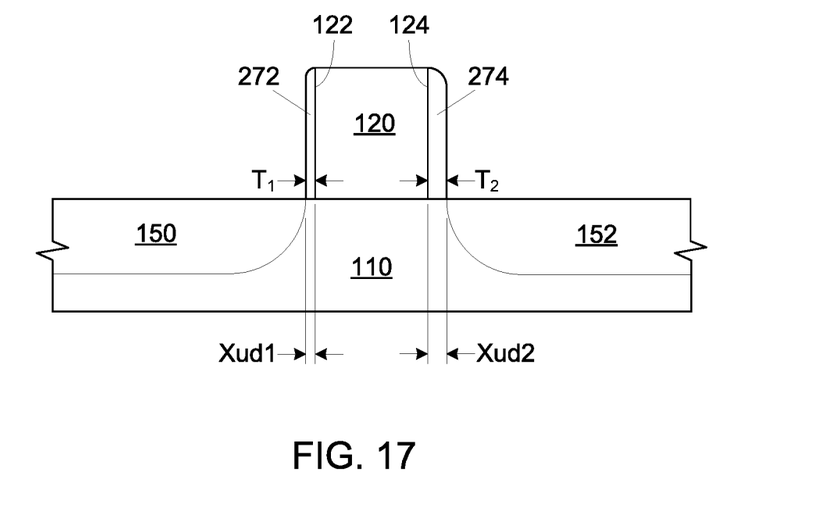

FIGS. 15-17 illustrate a method of forming asymmetric doped regions for a microelectronic transistor. Beginning at FIG. 2, an angled etch 270 may be performed at an appropriate angle relative to the transistor gate 120, wherein the angled etch 270 is directed toward the transistor gate first sidewall 122, as shown in FIG. 15. As shown in FIG. 16, the angled etch 270 (see FIG. 15) may result in asymmetric gate spacers, e.g. a first asymmetric gate spacer 272 abutting the transistor gate first sidewall 122 and a second asymmetric gate spacer 274 abutting the transistor gate second sidewall 124, wherein a thickness $T_1$ of the first asymmetric gate spacer 272 is smaller than a thickness $T_2$ of the second asymmetric gate spacer 274. Furthermore, the angled etch 270 may expose a first portion 282 of the microelectronic substrate 110 proximate the first asymmetric gate spacer 272 and may expose a second portion 284 of the microelectronic substrate 110 proximate the second asymmetric gate spacer 274.

As shown in FIG. 17, the first doped region 150 (such as a source region) may then be formed in the microelectronic substrate 110 at the exposed first portion 282 and the second doped region 152 (such as a drain region) may be formed in the microelectronic substrate 110 at the exposed second portion 284. In one embodiment, the first doped region 150 and the second doped region 152 may both be formed with a p-type dopant (forming p-type doped regions) for the formation of the pMOS microelectronic transistor. In another embodiment, the first doped region 150 and the second doped region 152 may both be formed with an n-type dopant (forming n-type doped regions) for the formation of an nMOS microelectronic transistor. In still another embodiment, with additional lithographic steps (as will be understood to those skilled in the art), the first doped region 150 may be one of a p-type doped region or a n-type doped region, which is opposite to that of the second doped region 152 for the formation of a tunnel field effect transistor (TFET).

As further illustrated in FIG. 17, as the thickness $T_1$ of the first asymmetric gate spacer 272 is smaller than a thickness $T_2$ of the second asymmetric gate spacer 274, the first doped region 150 will be either closer to or further under (illustrated as first underlap Xud1) the transistor gate 120 than the second doped region 152 (illustrated as second underlap Xud2), which is achieved with without any additional mask and lithographic processes. Thus, as will be understood to those skilled in the art, the asymmetry between the first doped region 150 and the second doped region 152 relative to the transistor gate 120 can enable a lower overlap capacitance on the drain side (e.g. the second doped region 152) and a matched external resistance on the source side (e.g. the first doped region 150).

Figure 18:
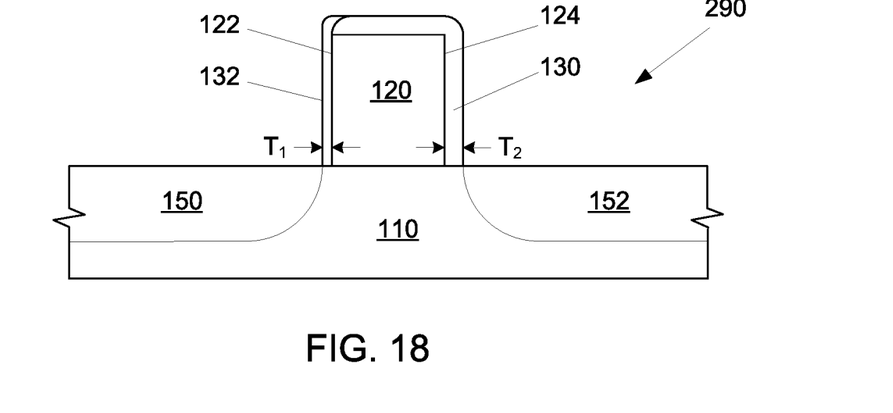
FIGS. 18-20 are side cross-sectional views of microelectronic structures having asymmetric spacers, according to several embodiments of the present description.
Figure 19:
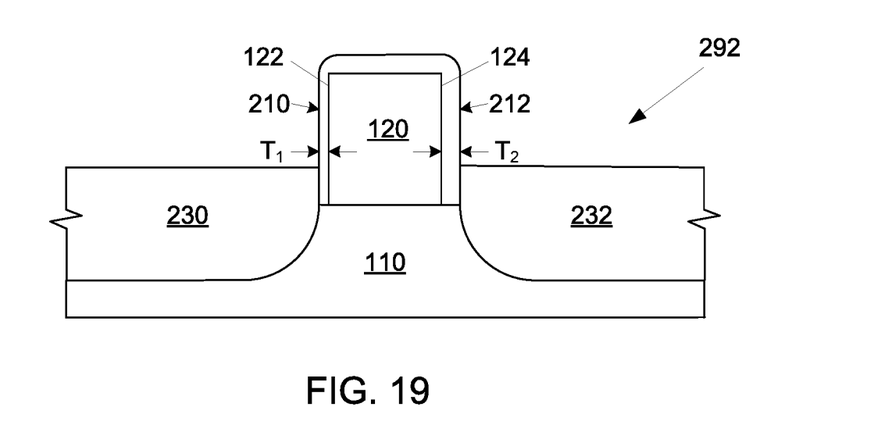
Figure 20:
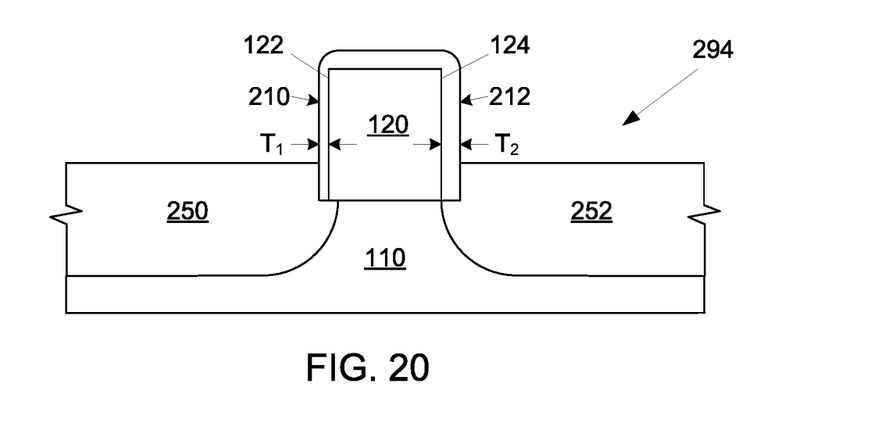

The concept of asymmetric spacers of FIGS. 15-17 may be extended to processes illustrated in FIGS. 1-14. In the process illustrated in FIGS. 1-7, the formation of the first asymmetric gate spacer 272 and the second asymmetric gate spacer 274 may result in the microelectronic structure 290 of FIG. 18. In the process illustrated in FIGS. 8-11, the formation of the first asymmetric gate spacer 272 and the second asymmetric gate spacer 274 may result in the microelectronic structure 292 of FIG. 19. In the process illustrated in FIGS. 12-14, the formation of the first asymmetric gate spacer 272 and the second asymmetric gate spacer 274 may result in the microelectronic structure 294 of FIG. 20.

Figure 21:
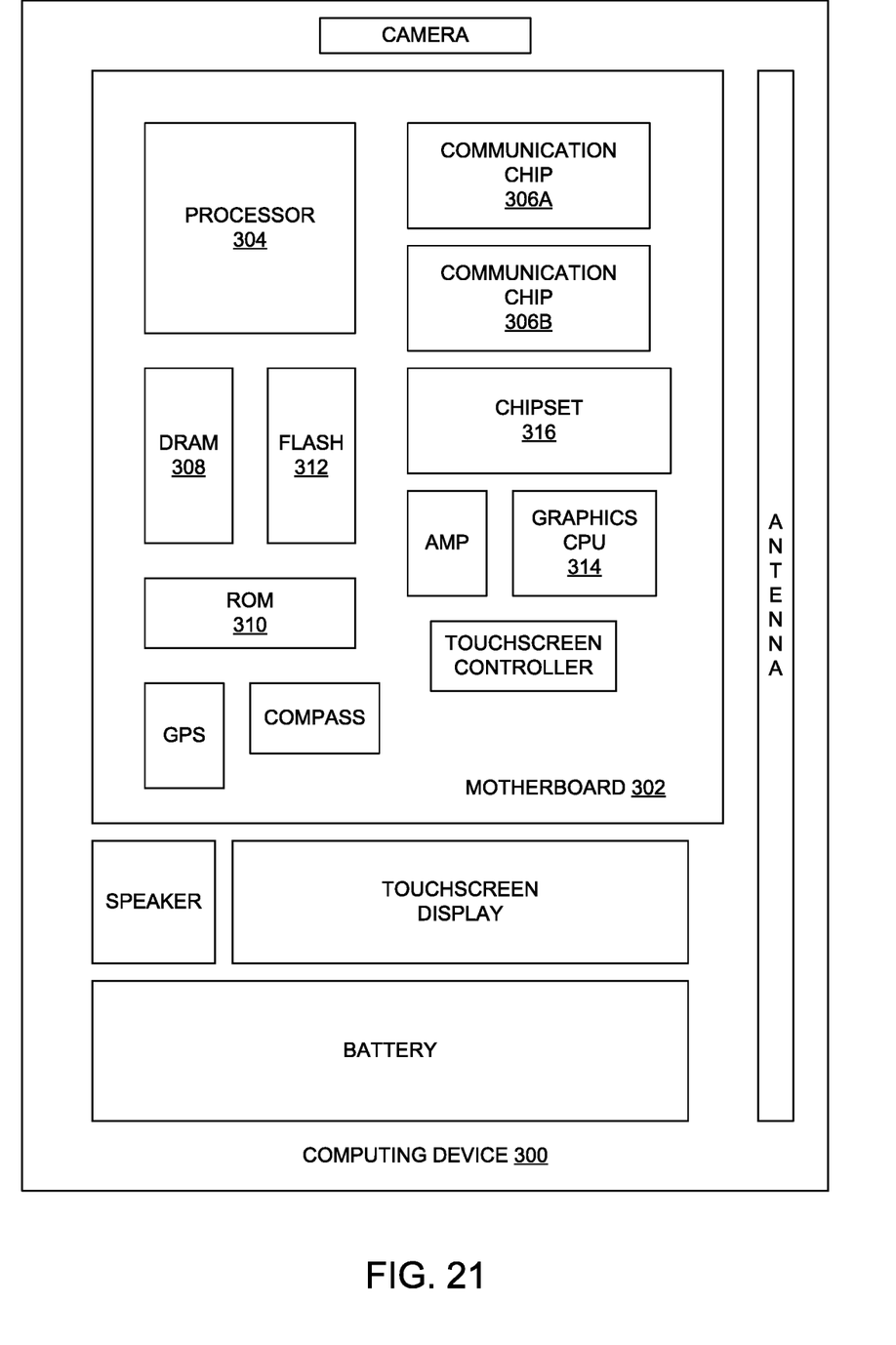
FIG. 21 illustrates a computing device in accordance with one implementation of the present description.

FIG. 21 illustrates a computing device 300 in accordance with one implementation of the present description. The computing device 300 houses a board 302. The board may include a number of microelectronic components, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chips 306A, 306B enable wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306A, 306B. For instance, a first communication chip 306A may be dedicated to shorter range wireless communications such as Wi-Fi and Bluetooth and a second communication chip 306B may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 300 may include microelectronic devices having at least one microelectronic transistor described above and/or having at least one microelectronic transistor fabricated in the manner described above.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-21. The subject matter may be applied to other microelectronic device and assembly applications, as well as any other appropriate transistor applications, as will be understood to those skilled in the art.

The following examples pertain to further embodiments, wherein Example 1 is a microelectronic transistor, comprising a transistor gate disposed on a microelectronic substrate, wherein the transistor gate includes a first sidewall and an opposing side sidewall; a first transistor gate spacer abutting the first sidewall of the transistor gate; and a second transistor gate spacer abutting the second sidewall of the transistor; wherein the second transistor gate spacer has a thickness that is greater than a thickness of the first transistor gate spacer.

In Example 2, the subject matter of Example 1 can optionally include a first doped region in the microelectronic substrate proximate the transistor gate first sidewall and a second doped region proximate the transistor gate second sidewall, wherein the first doped region is either closer to or further under the transistor gate than the second doped region.

In Example 3, the subject matter of Example 2 can optionally include the first doped region comprising one of a p-type doped region and an n-type doped region; and wherein the second doped region comprises one of a p-type doped region and an n-type doped region.

The following examples pertain to further embodiments, wherein Example 4 is a method for forming a microelectronic transistor, comprising forming a transistor gate on a microelectronic substrate, wherein the transistor gate includes a first sidewall and an opposing side sidewall; depositing a first spacer material layer over the transistor gate and over the microelectronic substrate; and performing an angled etch directed toward the transistor gate first sidewall to form a first transistor gate spacer abutting the first sidewall of the transistor gate.

In Example 5, the subject matter of Example 4 can optionally include performing the angled etch forming a second transistor gate spacer abutting the second sidewall of the transistor; and wherein the second transistor gate spacer has a thickness that is greater than a thickness of the first transistor gate spacer.

In Example 6, the subject matter of Example 4 can optionally include performing the angled etch exposing a first portion of the microelectronic substrate proximate the first transistor gate spacer, and further comprising forming a first doped region in the microelectronic substrate at the first portion of the microelectronic substrate.

In Example 7, the subject matter of Example 6 can optionally include performing the angled etch exposing a second portion of the microelectronic substrate proximate the second transistor gate spacer, and further comprising forming a second doped region in the microelectronic substrate at the second portion of the microelectronic substrate.

In Example 8, the subject matter of Example 7 can optionally include the first doped region is either closer to or further under the transistor gate than the second doped region.

In Example 9, the subject matter of either Example 7 or 8 can optionally include forming the first doped region comprising forming one of a p-type doped region and an n-type doped region, and wherein forming the second doped region comprises forming one of a p-type doped region and an n-type doped region.

In Example 10, the subject matter of Example 4 can optionally include performing the angled etch directed toward the transistor gate first sidewall comprises performing the angled etch directed from between about 5 and 25 degrees from vertical.

The following examples pertain to further embodiments, wherein Example 11 is a method of fabricating a microelectronic transistor, comprising forming a transistor gate on a microelectronic substrate, wherein the transistor gate includes a first sidewall and an opposing side sidewall; depositing a first spacer material layer over the transistor gate and over the microelectronic substrate; performing a first angled etch directed toward the transistor gate first sidewall to remove at least a portion of the first spacer material layer from the transistor gate first sidewall and from the microelectronic substrate proximate the transistor gate first sidewall forming a first exposed portion of microelectronic substrate; forming a first doped region in the first exposed portion of the microelectronic substrate; depositing a second spacer material layer over the first spacer material layer, the transistor gate first sidewall, and the first doped region, wherein depositing the second spacer material layer over the first spacer material layer forms a spacer material bi-layer; performing a second angled etch directed toward the transistor gate second sidewall to remove at least a portion of the spacer material bi-layer from the transistor gate second sidewall and from the microelectronic substrate proximate the transistor gate first sidewall forming a second exposed portion of microelectronic substrate; and forming a second doped region in the second exposed portion of the microelectronic substrate.

In Example 12, the subject matter of Example 11 can optionally include performing the first angled etch directed toward the transistor gate first sidewall removing the first spacer material layer from the transistor gate first sidewall, and performing the second angled etch directed toward the transistor gate second sidewall removing the spacer material bi-layer from the transistor gate second sidewall.

In Example 13, the subject matter of Example 11 can optionally include performing the first angled etch directed toward the transistor gate first sidewall removing a portion the first spacer material layer from the transistor gate first sidewall to form a first spacer, and performing the second angled etch directed toward the transistor gate second sidewall removing a portion of the spacer material bi-layer from the transistor gate second sidewall to form a second spacer.

In Example 14, the subject matter of Example 11 can optionally include the second spacer having a thickness that is greater than a thickness of the first spacer.

In Example 15, the subject matter of Example 11 can optionally include forming the first doped region comprising forming one of a p-type doped region and an n-type doped region and wherein forming the second doped region comprises forming the other of the p-type doped region and the n-type doped region.

In Example 16, the subject matter of Example 11 can optionally include forming at least one of the first doped region and the second doped region comprising anisotropically etching a recess in the microelectronic substrate, and performing a regrowth process.

In Example 17, the subject matter of Example 11 can optionally include forming at least one of the first doped region and the second doped region comprising isotropically etching a recess in the microelectronic substrate, and performing a regrowth process.

In Example 18, the subject matter of Example 11 can optionally include performing the angled etch directed toward the transistor gate first sidewall comprising performing the angled etch directed from between about 5 and 25 degrees from vertical.

The following examples pertain to further embodiments, wherein Example 19 is an electronic system, comprising a board; and a microelectronic device attached to the board, wherein the microelectronic device includes at least one microelectronic transistor comprising a transistor gate disposed on a microelectronic substrate, wherein the transistor gate includes a first sidewall and an opposing side sidewall; a first transistor gate spacer abutting the first sidewall of the transistor gate; and a second transistor gate spacer abutting the second sidewall of the transistor; wherein the second transistor gate spacer has a thickness that is greater than a thickness of the first transistor gate spacer.

In Example 20, the subject matter of Example 19 can optionally include a first doped region in the microelectronic substrate proximate the transistor gate first sidewall and a second doped region proximate the transistor gate second sidewall, wherein the first doped region is either closer to or further under the transistor gate than the second doped region.

In Example 21, the subject matter of Example 20 can optionally include the first doped region comprising one of a p-type doped region and an n-type doped region; and wherein the second doped region comprises one of a p-type doped region and an n-type doped region.

Having thus described in detail embodiments of the present description, it is understood that the present description defined by the appended claims is not to be limited by particular details set forth in the above description, as many apparent variations thereof are possible without departing from the spirit or scope thereof.

What is claimed is:
1. A microelectronic transistor, comprising:
 a transistor gate disposed on a microelectronic substrate, wherein the transistor gate includes a first sidewall and an opposing second sidewall;
 a first transistor gate spacer abutting the first sidewall of the transistor gate;
 a second transistor gate spacer abutting the second sidewall of the transistor gate;
 wherein the second transistor gate spacer has a thickness that is greater than a thickness of the first transistor gate spacer;
 a first doped region, wherein at least a portion of the first doped region extends above the microelectronic substrate and contacts the first transistor gate spacer above the microelectronic substrate; and
 a second doped region, wherein at least a portion of the second doped region extends above the microelectronic substrate and contacts the second transistor gate spacer above the microelectronic substrate;
 wherein a portion of the transistor gate extends above the first doped region and the second doped region, and wherein a remaining portion of the transistor gate extends between the first doped region and the second doped region.
2. The microelectronic transistor of claim 1, wherein the first doped region is either closer to or further under the transistor gate than the second doped region.

3. The microelectronic transistor of claim 1, wherein the first doped region comprises one of a p-type doped region and an n-type doped region; and wherein the second doped region comprises one of a p-type doped region and an n-type doped region.

4. An electronic system, comprising:
   a board; and
   a microelectronic device attached to the board, wherein the microelectronic device includes at least one microelectronic transistor comprising:
      a transistor gate disposed on a microelectronic substrate, wherein the transistor gate includes a first sidewall and an opposing second sidewall;
      a first transistor gate spacer abutting the first sidewall of the transistor gate;
      a second transistor gate spacer abutting the second sidewall of the transistor gate;
      wherein the second transistor gate spacer has a thickness that is greater than a thickness of the first transistor gate spacer;
      a first doped region, wherein at least a portion of the first doped region extends above the microelectronic substrate and contacts the first transistor gate spacer above the microelectronic substrate; and
      a second doped region, wherein at least a portion of the second doped region extends above the microelectronic substrate and contacts the second transistor gate spacer above the microelectronic substrate;
      wherein a portion of the transistor gate extends above the first doped region and the second doped region, and wherein a remaining portion of the transistor gate extends between the first doped region and the second doped region.

5. The electronic system of claim 4, wherein the first doped region is either closer to or further under the transistor gate than the second doped region.

6. The electronic system of claim 4, wherein the first doped region comprises one of a p-type doped region and an n-type doped region; and wherein the second doped region comprises one of a p-type doped region and an n-type doped region.

* * * * *